(12) United States Patent
Mikasa

(10) Patent No.: US 7,705,401 B2
(45) Date of Patent: Apr. 27, 2010

(54) SEMICONDUCTOR DEVICE INCLUDING A FIN-CHANNEL RECESS-GATE MISFET

(75) Inventor: Noriaki Mikasa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/955,968

(22) Filed: Dec. 13, 2007

(65) Prior Publication Data

US 2008/0142881 A1 Jun. 19, 2008

(30) Foreign Application Priority Data

Dec. 19, 2006 (JP) .............................. 2006-341634

(51) Int. Cl.
*H01L 21/336* (2006.01)

(52) U.S. Cl. ............... 257/347; 257/401; 257/E29.052; 438/284; 438/296

(58) Field of Classification Search ................. 257/347, 257/354, 401, E29.052; 438/284, 296
See application file for complete search history.

(56) References Cited

U.S. PATENT DOCUMENTS 6,765,303 B1 * 7/2004 Krivokapic et al. ......... 257/347

7,394,116 B2 * 7/2008 Kim et al. .................... 257/213

FOREIGN PATENT DOCUMENTS

| JP | 63-287064 | 11/1988 |
|----|-----------|---------|
| JP | 2004-533728 | 11/2004 |
| JP | 2005-236305 | 9/2005 |
| JP | 2006-013521 | 1/2006 |
| JP | 2006-269760 | 10/2006 |
| JP | 2006-310718 | 11/2006 |

OTHER PUBLICATIONS

J.Y. Kim et al., "Symposium on VLSI Technology Digest of Technical Papers," pp. 11-12, 2003.

* cited by examiner

*Primary Examiner*—Minh-Loan T Tran
(74) *Attorney, Agent, or Firm*—Scully, Scott, Murphy & Presser, P.C.

(57) ABSTRACT

A fin-channel recess-gate MISFET has a fin channel including a first portion configured by a portion of a silicon substrate and a second portion configured by a pair of silicon layers selectively grown on the silicon substrate. The first portion is disposed below the recess of the recess gate and above an isolation film of a STI structure formed on the silicon substrate. The second portion is disposed above the recess of the recess gate.

8 Claims, 11 Drawing Sheets

PRIOR ART

PRIOR ART

PRIOR ART

PRIOR ART

SEMICONDUCTOR DEVICE INCLUDING A FIN-CHANNEL RECESS-GATE MISFET

This application is based upon and claims the benefit of priority from Japanese patent application No 2006-341634, the disclosure of which is incorporated herein in its entirety by reference.

BACKGROUND OF THE INVENTION (a) Field of the Invention

The present invention relates to a semiconductor device including a fin-channel recess-gate MISFET (metal-insulator-semiconductor field-effect-transistor) and a method for manufacturing the semiconductor device including the fin-channel recess-gate MISFET.

(b) Description of the Related Art

Recently, new models of MISFET including a fin-channel MISFET having a fin channel and a recess-gate MISFET having a recess gate are expected to achieve a finer pattern size in a semiconductor device. The techniques for the fin-channel MISFET and recess-gate MISFET may be applied to a single MISFET to achieve a fin-channel recess-gate MISFET. FIGS. 7A to 11A show consecutive steps of a conceivable (or comparative) process for manufacturing a semiconductor device including such a fin-channel recess-gate MISFET. FIGS. 7B to 11B are sectional views taken along line B-B in FIGS. 7A to 11A, respectively, and FIG. 10C is a sectional view taken along line C-C in FIG. 10A.

The structure shown in FIGS. 7A and 7B is formed by the following steps. An array of dielectric film patterns 12, one of which is shown in those drawings, are formed on a silicon substrate 11 by a photolithographic and dry etching technique using a photoresist mask pattern. Subsequently, a trench 18 is formed on the surface region of the silicon substrate 11 by a dry etching technique using the dielectric film patterns 12 as an etching mask, followed by depositing an isolation film 13 within the trench 18 to form a shallow trench isolation (STI) structure. The height (h13) of the dielectric film 12 as measured from the bottom of the trench 18 of the STI structure to the top of the dielectric film 12 is set at a specific value in consideration of the dimensions of the fin channel and recess gate.

For example, the height h13 of the isolation film 13 is set at 400 nm assuming that the thickness of dielectric film patterns 12 is 100 nm, the height of fin channel is 100 nm, the depth of gate trench is 100 nm, and the depth of shallow trench 18 needed for isolation between adjacent device regions is 100 nm in the final structure of MISFETs. The isolation film 13 and shallow trench 18 are then polished using a CMP (chemical-mechanical-polishing) technique using the dielectric film patterns 12 as a stopper, thereby forming the structure shown in FIGS. 7A and 7B.

Subsequently, a photoresist pattern 21 having an opening in the central area of the dielectric film patterns 12 is formed by a photolithographic technique. The width d2 of the opening in the dielectric film patterns 12 is set at 50 nm. The dielectric film patterns 12 are then etched using the photoresist pattern 21 as an etching mask, to form an opening 19 in the dielectric film patterns 12 for exposing therethrough the silicon substrate 11. The resultant structure is shown FIGS. 8A and 8B.

Subsequently, the photoresist pattern 21 is removed, and a dry etching process is performed to the silicon substrate 11 by using the dielectric film patterns 12 as an etching mask, to thereby form a recess 23 for the gate electrode within the silicon substrate 11. The depth h2' of the recess 23 is set at 100 nm, for example. A wet etching process is then conducted to the dielectric film patterns 12 and the isolation film 13 of the STI structure. At this stage, the amount of wet etching is controlled so that the dielectric film patterns 12 are entirely removed and the height h 13' of the isolation film 13 remaining after the wet etching is 100 nm, for example. The resultant structure is shown in FIGS. 9A and 9B.

Thereafter, a gate insulation film 14 is formed on the exposed surface of the silicon substrate 11 by using a thermal oxidation technique, for example, followed by deposition of a gate electrode material. The thickness of the deposited gate electrode material is larger than the width d2 of the recess 23 in the silicon substrates 11, whereby the entire depth of the recess 23 is filled with the gate electrode material. Thereafter, the gate electrode material is polished using a CMP technique for planarization of the top surface thereof. The top surface of the gate electrode material has a height of h5 with respect to the top surface of the silicon substrate 11. The gate electrode material is then patterned to form a gate electrode (gate electrode line) 15 having a depth d5 of 70 nm, for example, which is larger than the width d2 of the recess 23, whereby both the edges of the gate electrode (i.e., gate electrode line) 15 are outside the recess 23. This structure is shown in FIGS. 10A and 10B, and also shown in FIG. 10C which is taken along line C-C in FIG. 10A, i.e., along the extending direction of the gate electrode line 15. The gate electrode 15 encircles the fin channel 20 at the top and side surfaces of the fin channel 20, as shown in FIG. 10C.

An insulation film is then formed on the entire surface including the surface of the gate electrode 15, followed by etch-back thereof to form a sidewall insulation film 16 on the sidewall of the gate electrode 15. An interlevel dielectric film and contact plugs penetrating therethrough are then formed to complete the structure of MISFETs, as shown in FIGS. 11A and 11B.

The fin-channel MISFET is described in Patent Publications Nos. JP-2004-533728A, -2005-236305A and -2006-13521A, for example. The recess-gate MISFET is described in a literature "Symposium on VLSI Technology Digest of Technical Papers", P 11-12, 2003 presented by J.Y. Kim et al.

In the comparative process for manufacturing the fin-channel recess-gate MISFET as described above, there is a problem in that the trench 18 of the STI structure during embedding the isolation film 13 within the trench 18 has a large aspect ratio to thereby incur occurrence of a void within the isolation film 13. The void, if formed in the isolation film 13, degrades the characteristics of the isolation film 13 and may increase the leakage current of the MISFET.

SUMMARY OF THE INVENTION

It is an object of the present invention to provide a semiconductor device including a fin-channel recess-gate MISFET having an improved transistor characteristic by suppressing occurrence of a void in the isolation film of a STI structure.

It is another object of the present invention to provide a method for manufacturing the semiconductor device as described above.

The present invention provides a semiconductor device including: a metal-insulator-semiconductor field-effect-transistor (MISFET) formed on a semiconductor substrate, the MISFET including a fin channel extending from a top surface of the semiconductor substrate and a recess gate having a portion formed in a recess, the fin channel includes a first portion configured by a portion of the semiconductor substrate and disposed below a bottom of the recess, and a second portion disposed above the first portion and configured by a selectively grown semiconductor layer.

The present invention also provides a method for manufacturing a semiconductor device including: forming a dielectric film pattern having a specific thickness on a semiconductor substrate; selectively etching the semiconductor substrate by using the dielectric film pattern as an etching mask to form a trench; depositing an isolation film within the trench; selectively etching the dielectric film pattern to form a pair of openings exposing therethrough a portion of the semiconductor substrate; selectively growing a semiconductor layer on the portion of the semiconductor substrate; removing the dielectric film pattern having the pair of openings; etching a top portion of the isolation film; forming a gate insulation film on a surface portion of the silicon substrate and at least a portion of the selectively grown semiconductor layer; and forming a gate electrode opposing the surface portion of the semiconductor substrate and the selectively grown semiconductor layer with an intervention of the gate insulation film.

The above and other objects, features and advantages of the present invention will be more apparent from the following description, referring to the accompanying drawings.

BRIEF DESCRIPTION OF THE DRAWINGS

FIGS. 1A to 6A are top plan views showing consecutive steps of a process for manufacturing a semiconductor device including a fin-channel recess-gate MISFET according to an embodiment of the present invention.

FIGS. 1B to 6B are sectional views taken along lines B-B in FIGS. 1A to 6A, respectively.

FIGS. 7A to 11A are top plan views showing consecutive steps of a comparative process for manufacturing a semiconductor device including a fin-channel recess-gate MISFET.

FIGS. 7B to 11B are sectional views taken along lines B-B in FIGS. 1A to 6A, respectively.

PREFERRED EMBODIMENT OF THE INVENTION

Figure 1A:
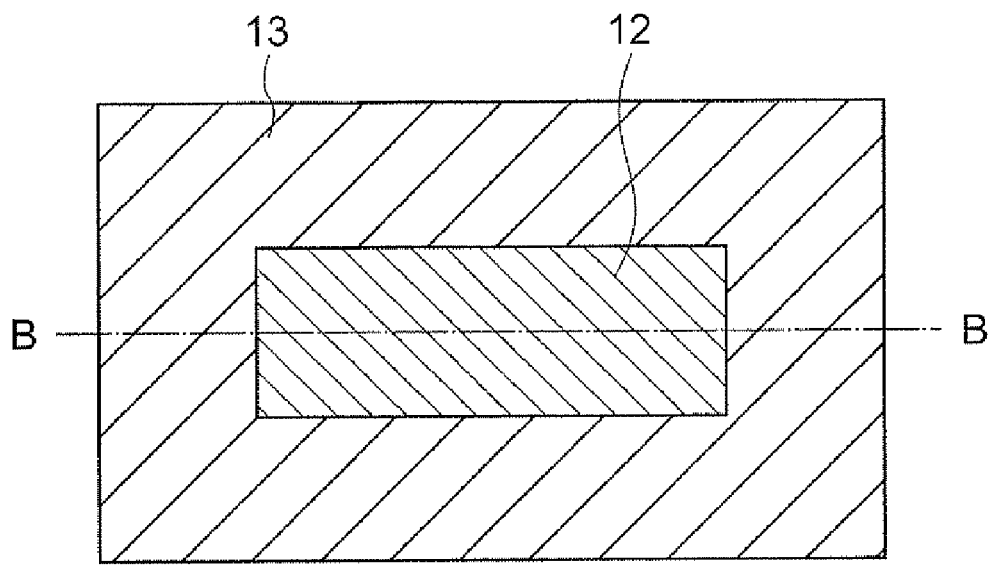

Now, an exemplary embodiment of the present invention will be described with reference to accompanying drawings, wherein similar constituent elements are designated by similar reference numerals throughout the drawings.

FIGS. 1A to 6A are top plan views showing consecutive steps of a process for manufacturing a semiconductor device including a fin-channel recess-gate MISFET according to an embodiment of the present invention. FIGS. 1B to 6B are sectional views taken along lines B-B in FIGS. 1A to 6A, respectively. FIG. 5C is a sectional view taken along line C-C in FIG. 5A. The process will be described hereinafter with reference to those drawing.

In the process, a dielectric film such as a silicon nitride film having a thickness h2 of 100 nm, for example, is first deposited on a silicon substrate 11. The silicon nitride film is then patterned using a photoresist mask pattern as an etching mask to form an array of dielectric film patterns 12 having a substantially rectangular planar shape. One of the dielectric film patterns 12 is shown in those drawings. The silicon substrate 11 is selectively etched using the dielectric film patterns 12 as an etching mask to form an isolation trench 18 of a STI structure in the surface region of the silicon substrate 11.

The STI structure has a height h3 as measured from the bottom thereof to the top of the dielectric film patterns 12, in consideration of the fin-channel of the MISFETs. The height h3 is about 300 nm, for example, which is a total of the thickness, 100 nm, of the dielectric film patterns 12, the height, 100 nm, of the fin channel to be formed, and the depth, 100 nm, of the final STI structure needed for isolating the device regions from one another.

Figure 1B:
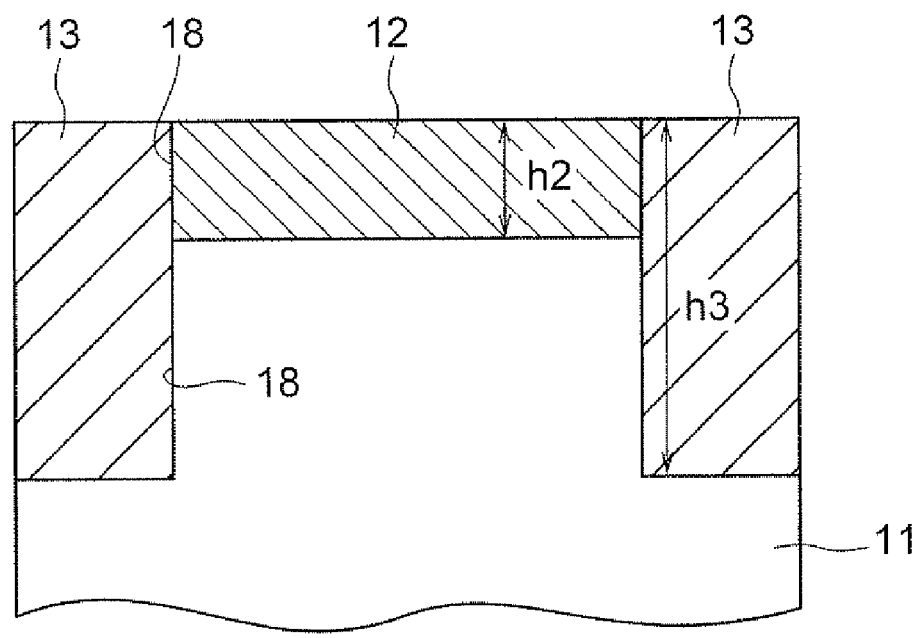

Subsequently, an isolation film 13 is deposited over the entire area including the internal of the isolation trench 18. The isolation film 13 is then polished by a CMP technique using the dielectric film patterns 12 as a stopper. The resultant structure is shown in FIGS. 1A and 1B.

Figure 2A:
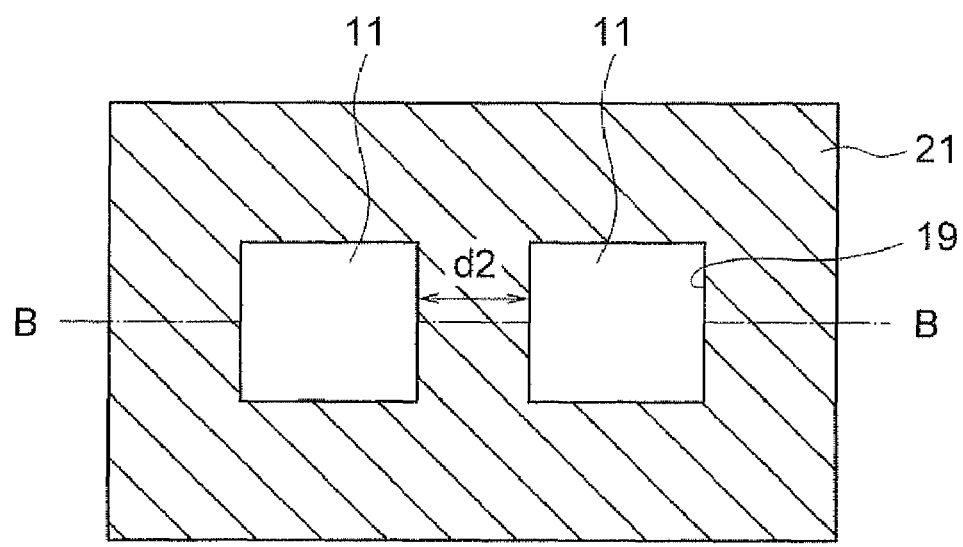
Figure 2B:
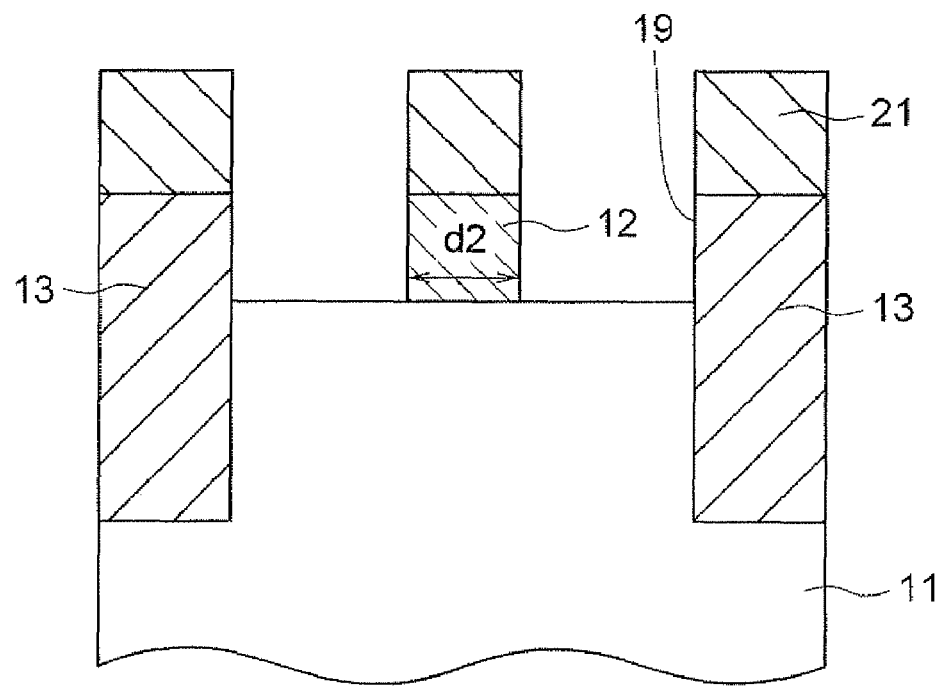

Subsequently, a photoresist mask pattern 21 having a pair of square openings 19 on each of the dielectric film patterns 12 is formed by a photolithographic technique. The width d2 of the slit formed between the pair of openings 19 is 50 nm, for example. The dielectric film patterns 12 are then etched by a dry etching technique using the photoresist mask pattern 21 as an etching mask. The resultant structure is such that a portion of the silicon substrate 11 is exposed from the pair of openings 19 of the dielectric film patterns 12, as shown in FIGS. 2A and 2B.

Figure 3A:
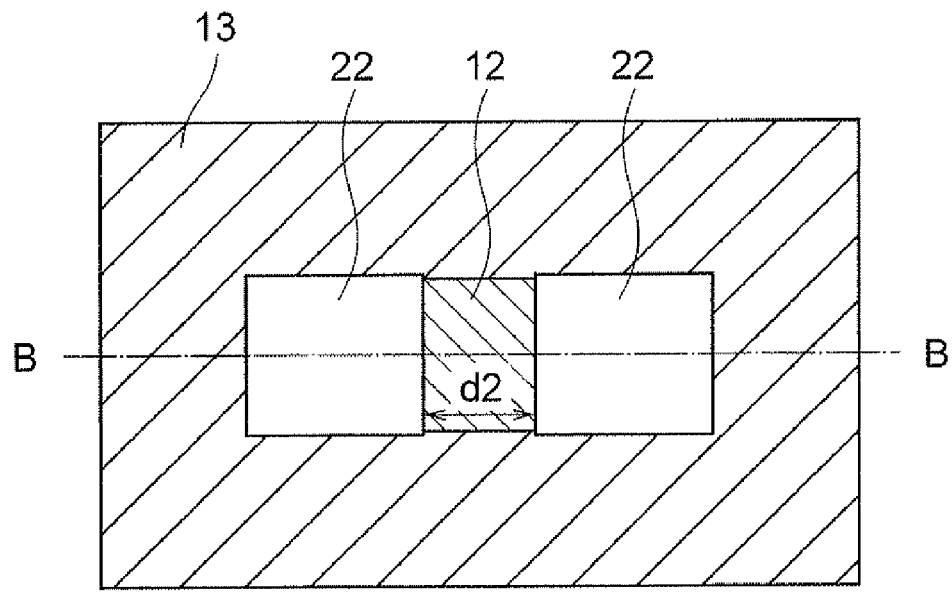
Figure 3B:
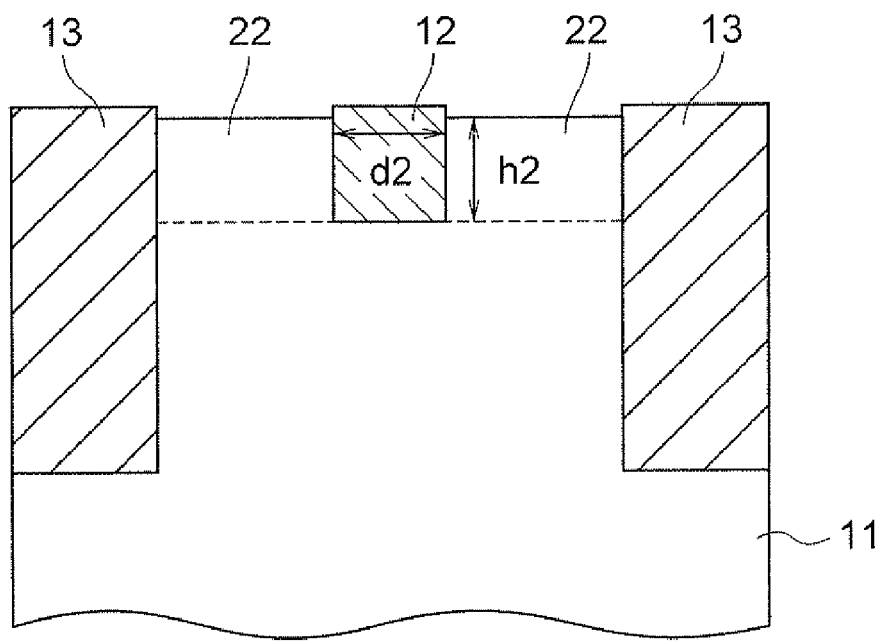

The photoresist mask pattern 21 is then removed, followed by deposition of silicon, by using a selective epitaxial process, onto the exposed surface of the silicon substrate 11 exposed from openings 19 of the dielectric film patterns 12, thereby forming thereon a selectively grown silicon films 22. The thickness of the selectively grown silicon films 22 is substantially same as or slightly smaller than the thickness of the dielectric film patterns 12. The resultant structure is shown in FIGS. 3A and 3B.

Figure 4A:
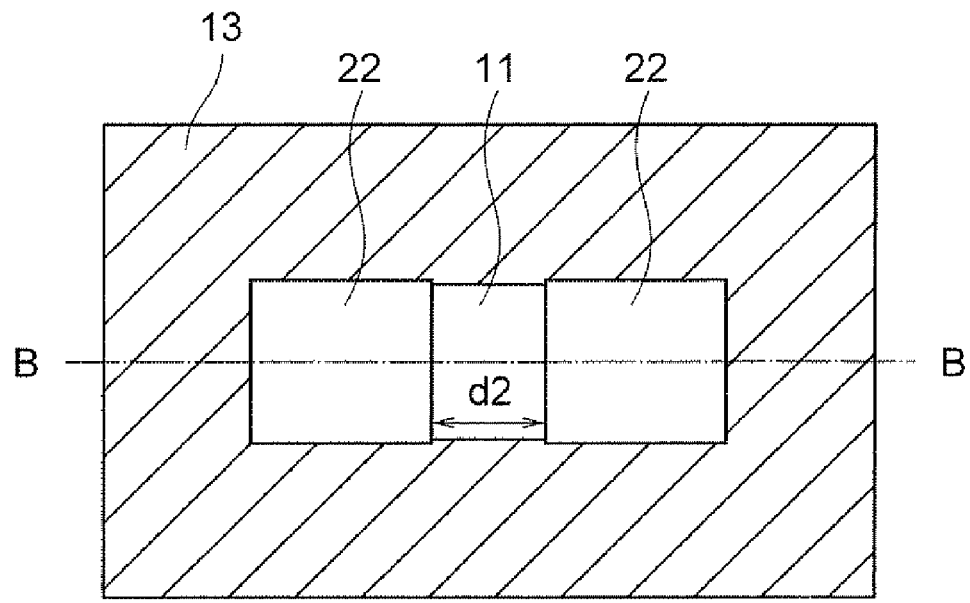
Figure 4B:
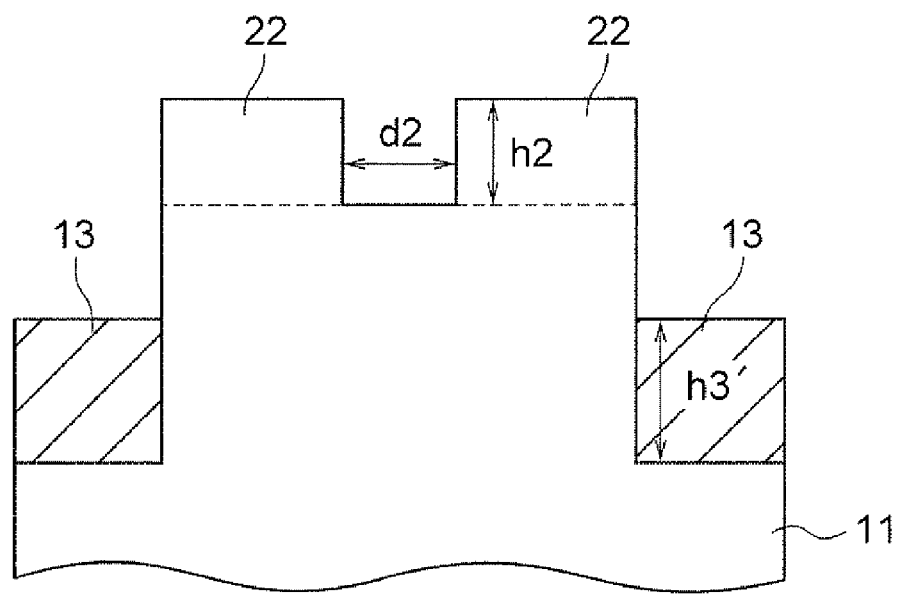

Subsequently, the dielectric film patterns 12 are removed using a wet etching technique. The isolation film 13 is also etched using a controlled wet etching process so that the remaining portion of the isolation film 13 has a height h3' of 100 nm, for example, as measured from the bottom of the trench 18. The resultant structure is shown in FIGS. 4A and 4B.

Subsequently, a gate insulation film 14 is formed on the exposed surface of the silicon substrate 11 and selectively grown silicon film 22 as by using a thermal oxidation technique. A gate electrode material is then deposited thereon by a sputtering technique etc. The thickness of the deposited gate electrode material is larger than the width d2 of the slit between the openings 19, whereby the silt is entirely covered by the deposited gate electrode material. Thereafter, the gate electrode material is polished using a CMP technique for planarization thereof. At this stage, the height of the top surface of the gate electrode material after the CNP as measured from the top surface of the selectively grown silicon films 22 is set at h5.

Figure 5A:
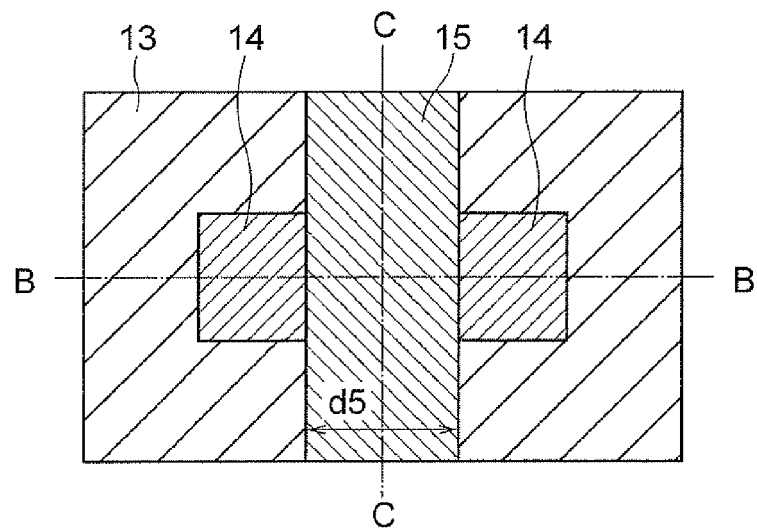
Figure 5B:
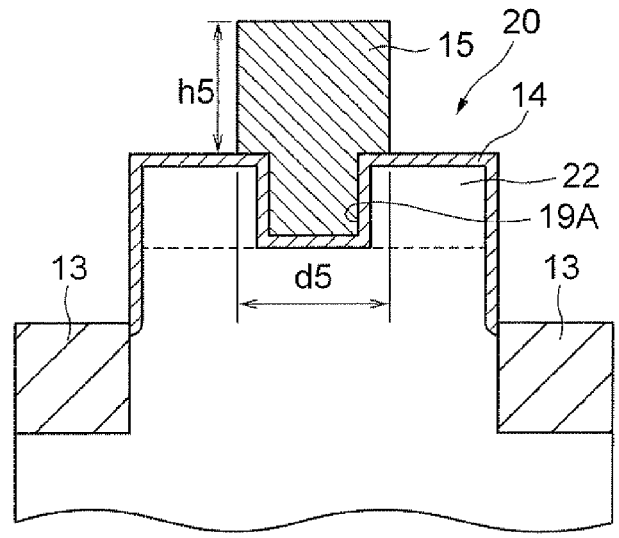
Figure 5C:
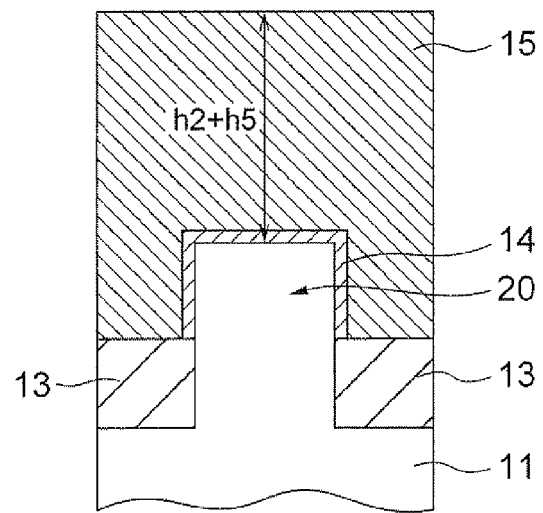
FIG. 5C is a sectional view taken along line C-C in FIG. 5A.

The gate electrode material is patterned using a photolithographic and dry etching technique, thereby forming a gate electrode (gate electrode line) 15. The width d5 of the gate electrode 15 is 70 nm, for example, which is larger than the width d2 of the slit between the selectively grown silicon layers 22, whereby both the edges of the gate electrode line 15, i.e., both the ends of gate electrode of MISFETs lie on the selectively grown silicon layers 22. Both the edges of gate electrode of MISFETs lie outside the edges of the selectively grown silicon layers 22. The resultant structure is shown in FIGS. 5A, 5B and 5C.

The fin channel 20 including source/drain regions includes a first portion which is configured by a portion of the silicon substrate 11 disposed below the bottom of the recess 19A of the gate electrode 15 and above the top surface of the isolation film 13, and a second portion which is disposed above the bottom of the recess 19A and configured by the selectively grown silicon layers 22. As understood from FIG. 5C, the first portion of the fin channel 20 is covered by the gate electrode 15 at the top and both side surfaces of the fin channel 20.

Figure 6A:
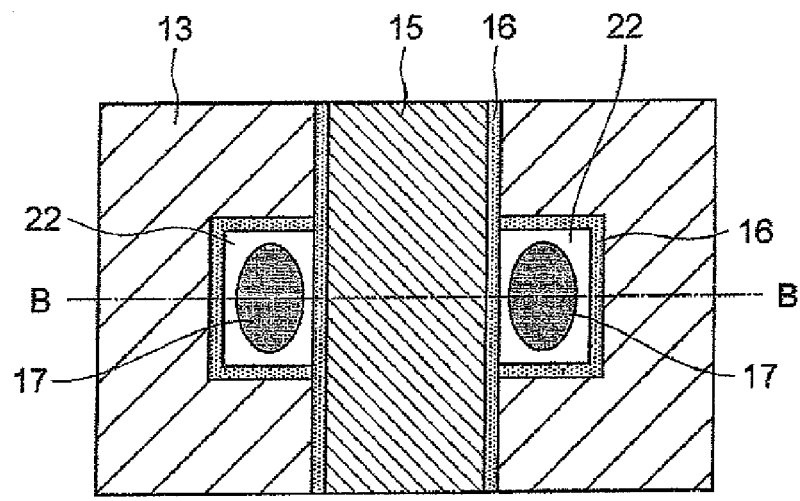
Figure 6B:
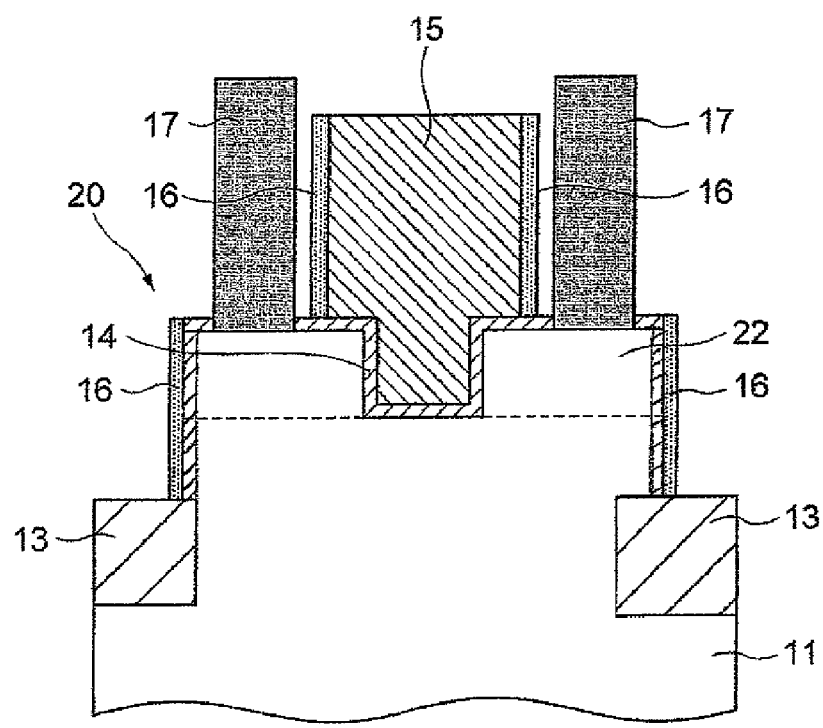
Figure 7A:
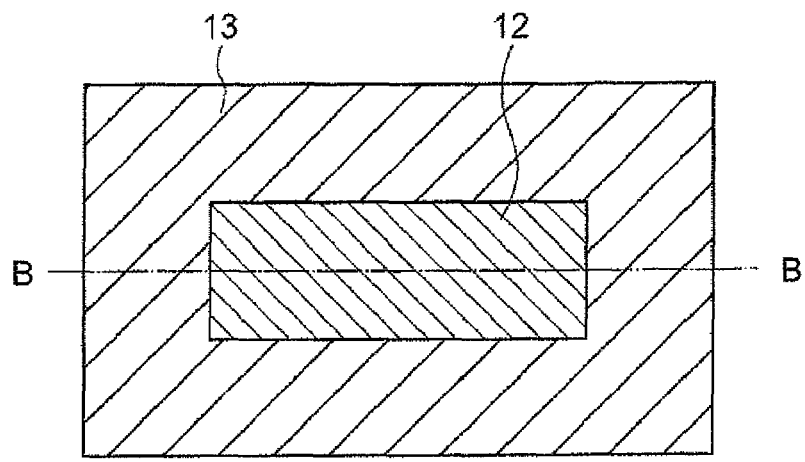
Figure 7B:
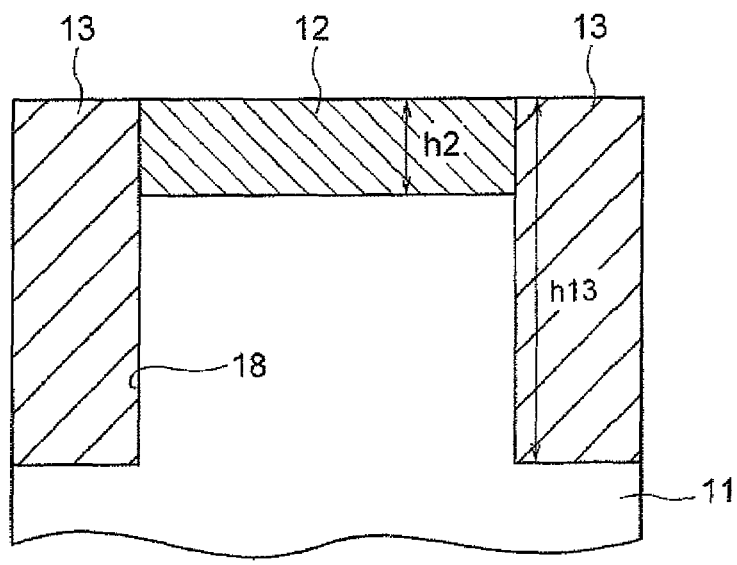
Figure 8A:
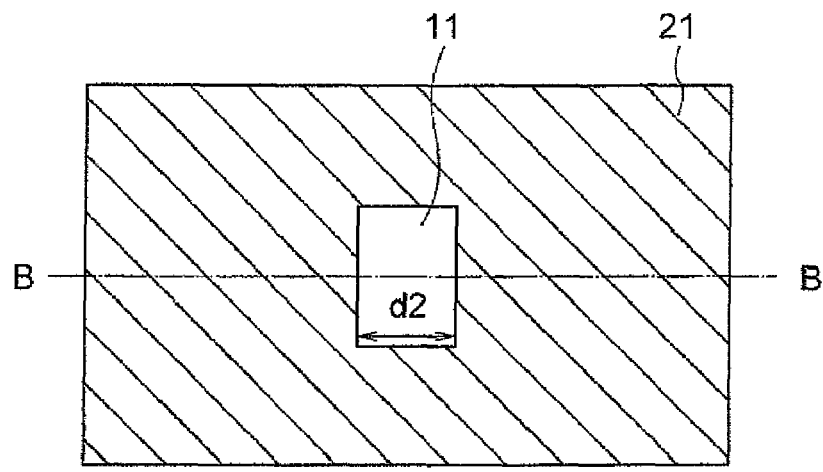
Figure 8B:
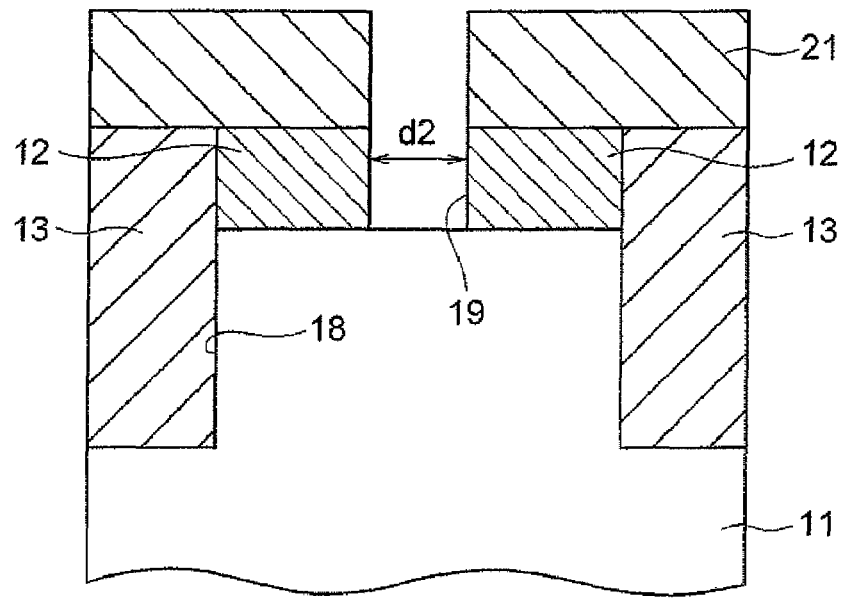
Figure 9A:
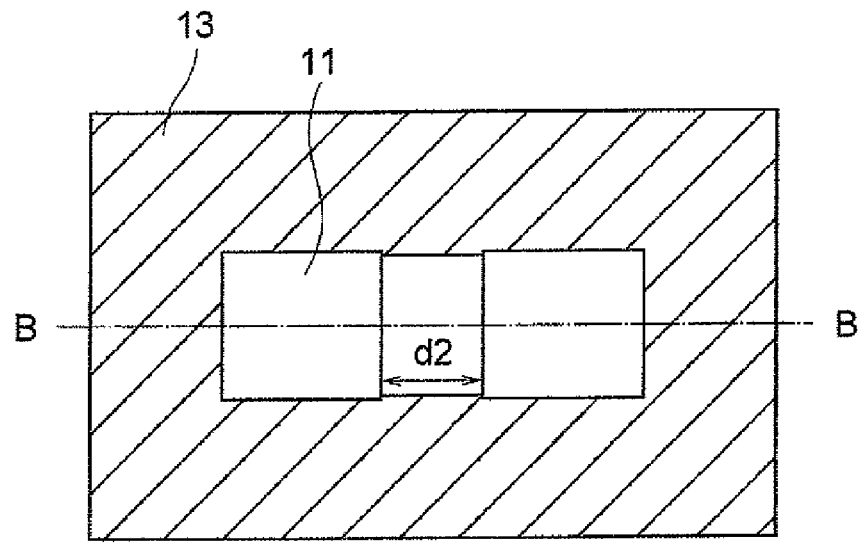
Figure 9B:
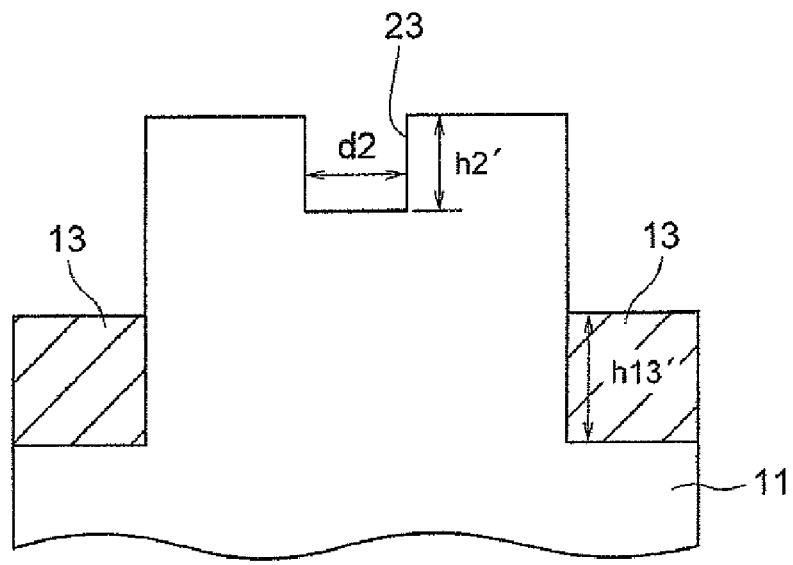
Figure 10A:
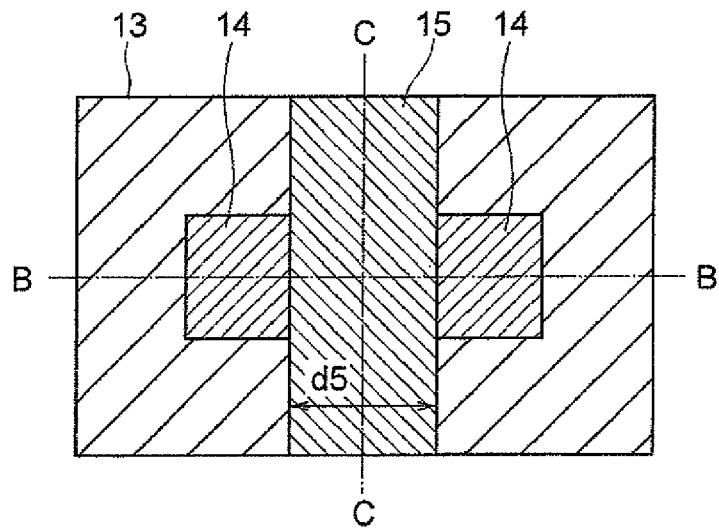
Figure 10B:
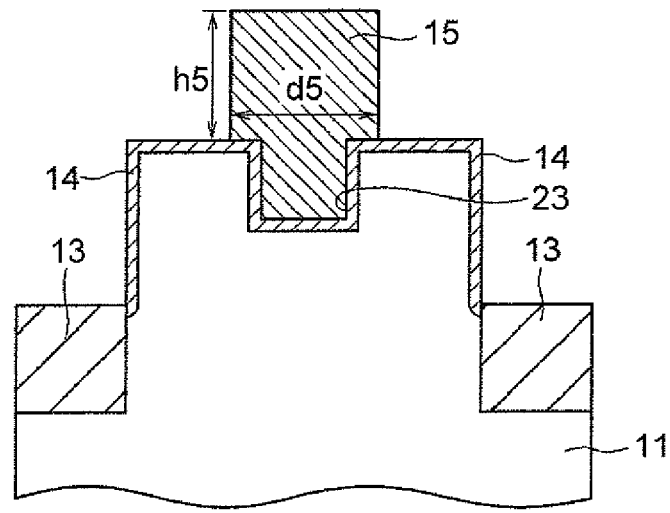
Figure 10C:
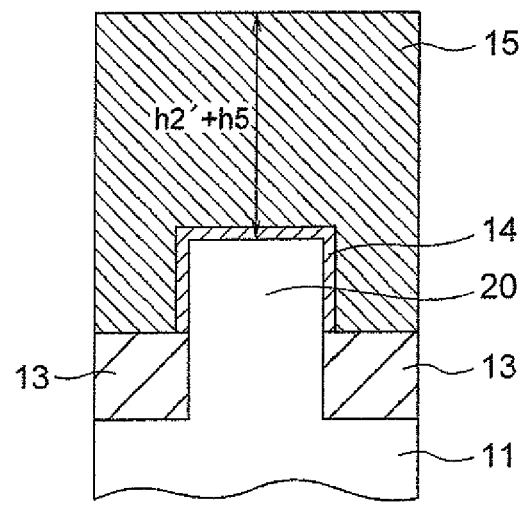
FIG. 10C is a sectional view taken along line C-C in FIG. 10A.
Figure 11A:
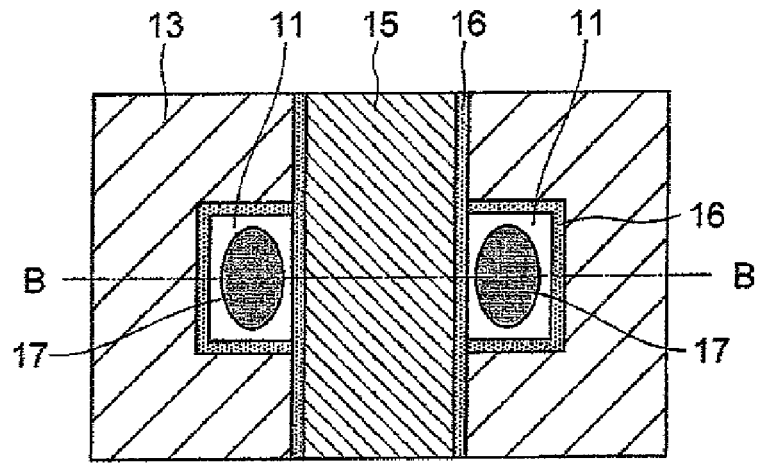
Figure 11B:
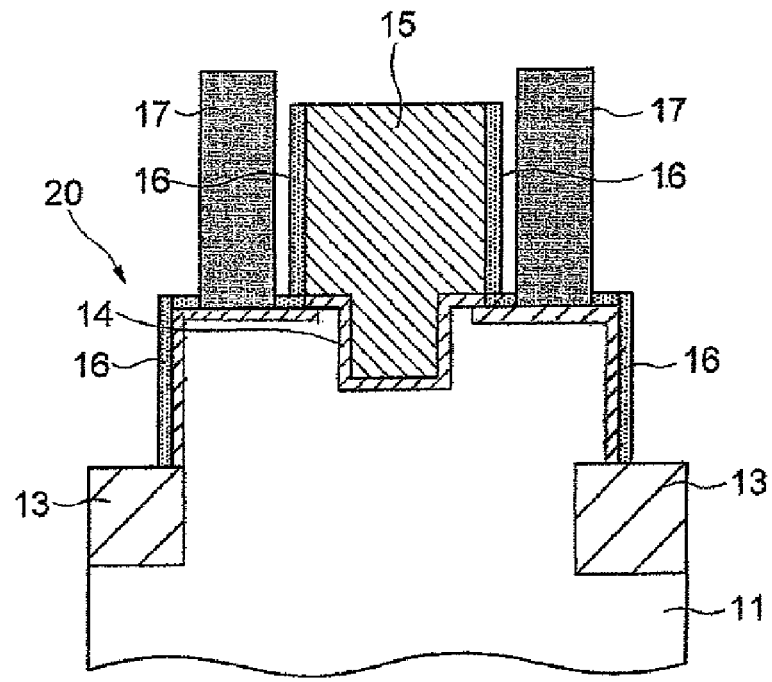

Thereafter, a dielectric film is deposited on the entire surface, and etched back using a dry etching technique to form a sidewall insulation film 16 on the side surfaces of the gate electrode 15 and selectively grown silicon layer 22, as shown in FIGS. 6A and 6B. Subsequently, an interlevel dielectric film is deposited on the entire surface, and contact plugs 17 penetrating the interlevel dielectric film are then formed on the source/drain regions configured by the selectively grown silicon layers 22, thereby completing the structure of MISFETs.

In the semiconductor device of the above embodiment, since the selectively grown silicon layers 22 having a thickness of 100 nm are formed on the surface of the silicon substrate 11, the isolation trench 18 of the STI structure has a depth smaller than that of the conventional isolation trench by the thickness of the selective grown silicon layers 22. The thickness of the selective grown silicon layers 22 corresponds to the depth of the recess 19A of the recess gate electrode 15. This provides a smaller aspect ratio of the isolation trench 18 during deposition of the isolation film 13 in the isolation trench 18. Thus, occurrence of a void can be avoided to improve the transistor characteristics of the fin-channel recess-gate MISFETs.

The conductivity type of the fin channel configured by the selectively grown silicon layers may be any of p-type conductivity and n-type conductivity. The dimensions, thickness and material of the selectively grown silicon layers as well as the gate electrode and insulation layers may be selected as desired, and thus may be modified from the above embodiment.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A method for manufacturing a semiconductor device comprising:
    forming a dielectric film pattern having a specific thickness on silicon semiconductor substrate;
    selectively etching said silicon semiconductor substrate by using said dielectric film pattern as an etching mask to form a trench;
    depositing an isolation film within said trench;
    selectively etching said dielectric film pattern to form a pair of openings exposing therethrough a portion of said silicon semiconductor substrate;
    selectively growing a silicon semiconductor layer on said portion of said semiconductor substrate;
    removing said dielectric film pattern having said pair of openings;
    etching a top portion of said isolation film;
    forming a gate insulation film on a surface portion of said silicon substrate and at least a portion of said selectively grown semiconductor layer; and
    forming a gate electrode opposing said surface portion of said silicon semiconductor substrate and said selectively grown semiconductor layer with an intervention of said gate insulation film.

2. A method for manufacturing a semiconductor device comprising:
    forming a dielectric film pattern having a specific thickness on a silicon substrate;
    selectively etching the silicon substrate by using the dielectric film pattern as an etching mask to form a trench in the silicon substrate;
    removing a part of the dielectric film pattern to form a pair of openings exposing therethrough a part of a surface of the silicon substrate;
    selectively growing a silicon layer on the part of the surface of the silicon substrate by using a selective epitaxial process;
    removing the dielectric film pattern by a wet etching process;
    removing a top portion of the isolation film to expose at least the side surface of the grown silicon layer;
    forming a gate insulation film; and
    forming a gate electrode facing a part of a surface of the grown silicon layer and the silicon substrate, with the gate insulation film therebetween.

3. The method for manufacturing a semiconductor device according to claim 2, wherein a part of a side surface of the trench formed in the silicon substrate is exposed after the step of removing the top portion of the isolation film.

4. The method for manufacturing a semiconductor device according to claim 2, wherein a thickness of the grown silicon layer is substantially the same as the thickness of the dielectric film pattern.

5. The method for manufacturing a semiconductor device according to claim 2, further comprising:
    forming a sidewall insulation film on side surfaces of both the gate electrode and the grown silicon layer.

6. The method for manufacturing a semiconductor device according to claim 5, further comprising:
    forming a contact plug directly connected to a top surface of the growing silicon layer 7. The method for manufacturing a semiconductor device according to claim 2, wherein the isolation film deposited within the trench is a silicon dioxide film.

8. The method for manufacturing a semiconductor device according to claim 7, wherein the step of removing the top portion of the isolation film is performed by a wet etching process.

* * * * *